United States Patent
Segovia Fernandez et al.

(10) Patent No.: US 11,646,714 B2
(45) Date of Patent: May 9, 2023

(54) LATERALLY VIBRATING BULK ACOUSTIC WAVE RESONATOR

(71) Applicant: Texas Instruments Incorporated, Dallas, TX (US)

(72) Inventors: Jeronimo Segovia Fernandez, San Jose, CA (US); Peter Smeys, San Jose, CA (US); Ting-Ta Yen, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 83 days.

(21) Appl. No.: 16/505,669

(22) Filed: Jul. 8, 2019

(65) Prior Publication Data

US 2020/0021272 A1   Jan. 16, 2020

Related U.S. Application Data

(60) Provisional application No. 62/696,213, filed on Jul. 10, 2018.

(51) Int. Cl.
| | | |
|---|---|---|
| *H03H 9/17* | (2006.01) | |
| *H03H 9/64* | (2006.01) | |
| *H03H 9/02* | (2006.01) | |
| *H03H 9/15* | (2006.01) | |
| *H03H 9/05* | (2006.01) | |

(52) U.S. Cl.
CPC ........ *H03H 9/175* (2013.01); *H03H 9/02275* (2013.01); *H03H 9/0542* (2013.01); *H03H 9/64* (2013.01); *H03H 2009/02299* (2013.01); *H03H 2009/155* (2013.01)

(58) Field of Classification Search
CPC . H03H 9/54–725; H03H 9/02228; H03H 9/17
See application file for complete search history.

(56) References Cited

U.S. PATENT DOCUMENTS

| | | | |
|---|---|---|---|
| 5,212,988 A * | 5/1993 | White | B01L 3/5027 73/599 |
| 6,087,198 A | 7/2000 | Panasik | |
| 6,498,548 B2 * | 12/2002 | Kaneda | H03H 9/6433 333/195 |
| 6,548,942 B1 | 4/2003 | Panasik | |

(Continued)

OTHER PUBLICATIONS

Yantchev et al. ("Micromachined Thin Film Plate Acoustic Resonators Utilizing the Lowest Order Symmetric Lamb Wave Mode"), ieee transactions on ultrasonics, ferroelectrics, and frequency control, vol. 54, No. 1, Jan. 2007 (Year: 2007).*

(Continued)

*Primary Examiner* — Hafizur Rahman
*Assistant Examiner* — Alan Wong
(74) *Attorney, Agent, or Firm* — Frank D. Cimino

(57) ABSTRACT

A laterally vibrating bulk acoustic wave (LVBAW) resonator includes a piezoelectric plate sandwiched between first and second metal layers. The second metal layer is patterned into an interdigital transducer (IDT) with comb-shaped electrodes having interlocking fingers. The width and pitch of the fingers of the electrodes determine the resonant frequency. A combined thickness of the first and second metal layers and the piezoelectric layer is less than the pitch of the interlocking fingers.

22 Claims, 13 Drawing Sheets

(56) References Cited

U.S. PATENT DOCUMENTS

| | | | |
|---|---|---|---|
| 6,862,441 B2* | 3/2005 | Ella | H03H 9/542 |
| | | | 455/114.2 |
| 7,245,193 B2* | 7/2007 | Funasaka | H03H 9/02574 |
| | | | 333/195 |
| 8,149,500 B2* | 4/2012 | Godshalk | H03H 3/04 |
| | | | 359/305 |
| 9,893,712 B2* | 2/2018 | Meltaus | H03H 9/568 |
| 10,284,170 B2* | 5/2019 | Okude | H03H 9/02157 |
| 10,333,487 B2* | 6/2019 | Kishino | H03H 9/14582 |
| 10,389,332 B2* | 8/2019 | Bhattacharjee | H03H 9/02244 |
| 10,938,367 B2* | 3/2021 | Bhattacharjee | H03H 9/173 |
| 2007/0267942 A1* | 11/2007 | Matsumoto | H03H 9/175 |
| | | | 310/313 A |

OTHER PUBLICATIONS

Robert Aigner, "SAW, BAW, and the future of wireless", EDN Network, available at https://www.edn.com/5G/4413442/SAW--BAW-and-the-future-of-wireless, May 6, 2013, pp. 1-5.

Jeronimo Segovia Fernandez et al, "Piezoelectric Resonator with Patterned Resonant Confiners", U.S. Appl. No. 16/290,873, filed Mar. 2, 2019, pp. 1-39.

"Highly Dispersive Bulk Acoustic Wave Resonators", U.S. Appl. No. 16/236,601, filed on Dec. 30, 2018, pp. 1-28.

\* cited by examiner

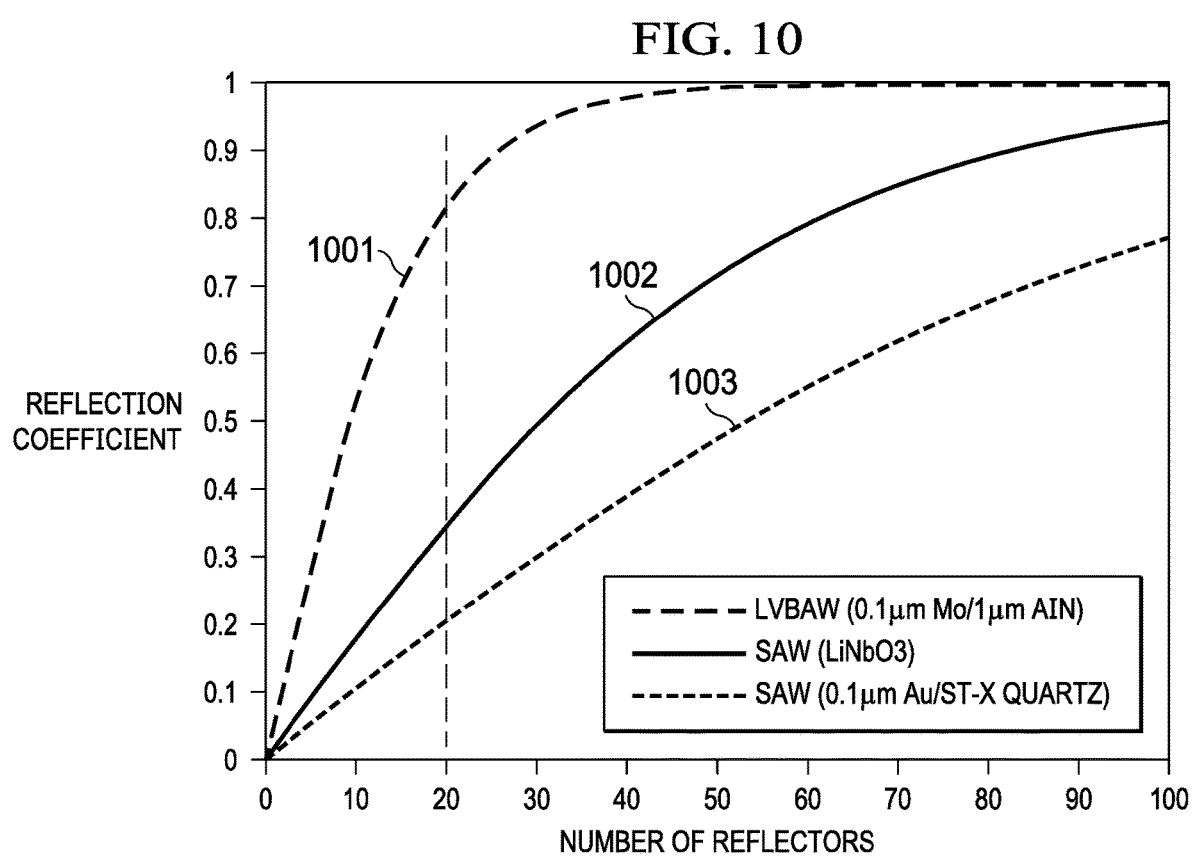

LATERALLY VIBRATING BULK ACOUSTIC WAVE RESONATOR

CROSS-REFERENCE TO RELATED APPLICATION

This application claims priority to U.S. Provisional Patent Application No. 62/696,213 filed 10 Jul. 2018, the entirety of which is incorporated herein by reference.

TECHNICAL FIELD

This relates to laterally vibrating bulk acoustic wave resonators.

BACKGROUND

Microelectromechanical system (MEMS) resonators are useful for multiple applications, such as low-power, low-phase noise, high stability oscillators. Usually, a challenging aspect of such devices is integrating the MEMS resonators with the integrated circuit chips in a regular semiconductor packaging. Multiple approaches have been used, such as wire-bonding, flip-chip, and CMOS-MEMS.

In at least one example, a bulk acoustic wave (BAW) resonator is a MEMS device that includes a piezoelectric thin film sandwiched between two electrodes and acoustically isolated from the surrounding medium. Some BAW resonators may use piezoelectric films with thicknesses ranging from several micrometers down to tenth of micrometers, and they may resonate in a frequency range of 100 MHz to 10 GHz. Aluminum nitride and zinc oxide are two examples of piezoelectric materials in MEMS acoustic wave resonators.

SUMMARY

An example laterally vibrating bulk acoustic wave (LVBAW) resonator includes a piezoelectric plate sandwiched between metal layers. An upper metal layer is patterned into an interdigital transducer (IDT) with comb-shaped electrodes having interlocking fingers. The width and pitch of the fingers of the electrodes determine the resonant frequency. The combined thickness of the upper metal layer, a lower metal layer and the piezoelectric layer is less than the pitch of the interlocking fingers.

BRIEF DESCRIPTION OF THE DRAWINGS

FIG. 10 is a plot illustrating reflection coefficient vs number of reflectors in example resonators.

DETAILED DESCRIPTION

Figure 1:
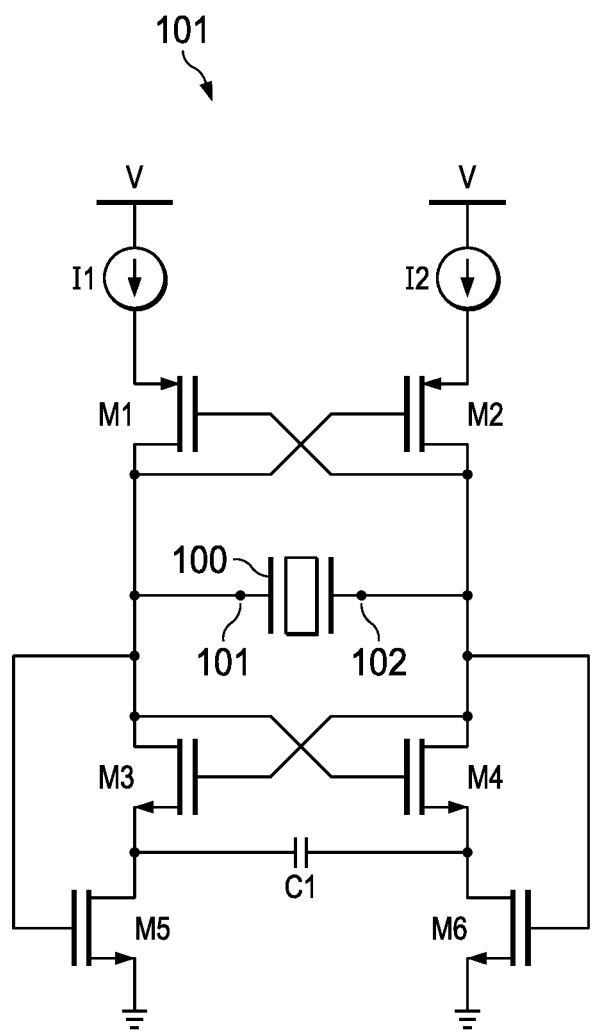
FIG. 1 is a schematic of an example oscillator circuit that includes a laterally vibrating BAW resonator device.

In the drawings, like elements are denoted by like reference numerals for consistency.

A BAW device may be formed by a piezoelectric plate sandwiched between electrodes and an acoustic Bragg mirror in an unreleased acoustic structure in which its resonance frequency (fr) is primarily defined by the acoustic phase velocity (vp) and the height of the vibrating piezoelectric stack (h) such that fr=vp/(2 h). Consequently, the frequency is affected by the thickness of the piezoelectric stack, resulting in a fixed, limited frequency range for one fabrication process. Mass load splits can be added to achieve certain frequency tunability on the same wafer, but additional steps further increase manufacturing time and cost. Frequency tunability is useful for filters because series and shunt resonators have different center frequencies, and oscillators when various frequency modulators are implemented in the same RF front-end system.

Surface acoustic wave (SAW) devices, which rely on the excitation of Rayleigh waves on a piezoelectric substrate, have been employed in telecommunication, radar and broadcasting systems for years. However, these devices are usually limited to <1 GHz applications, cannot be monolithically integrated with CMOS and require large footprints. Alternatively, contour mode resonators (CMRs), which rely on the excitation of low-dispersive S0-mode Lamb waves in a piezoelectric thin film, have emerged as replacements for SAWs, because they enable the same lithographic frequency tunability, while offering better resonator performance above 1 GHz, monolithic integration with CMOS and smaller footprints. That type of MEMS device requires releasing steps to separate the active region from the substrate for energy confinement, which increases a risk of failure during vibration or shock tests, needs costly wafer-level packaging, and becomes unsuitable for high power applications. "Releasing" requires creation of a space between the active region of the piezoelectric film and the substrate on which it is mounted.

A laterally vibrating bulk acoustic wave (LVBAW) resonator architecture, which is described hereinbelow, exhibits lateral vibrations in an unreleased substrate configuration and offers the advantages of contour mode resonator technology: full lithographic tunability, CMOS integration and small footprints. The LVBAW device is based on a piezoelectric plate sandwiched between metal layers and either a bottom Bragg mirror (BM) or both bottom and top BMs. The upper metal is patterned to form an interdigital transducer (IDT) and side reflectors while the lower metal can work as a non-electrified floating plate in a 1-port configuration or a ground plate in a 2-port configuration with a single IDT or isolated IDTs. The electrode pitch (p) sets the LVBAW resonance frequency (fr) and that requires that the equivalent thickness of the laterally-vibrating film formed by the piezoelectric layer and electrode metals (h) is less than one-half the electrode pitch. Thus, $p=\lambda/2$ and $h<\lambda/4$. The acoustic BMs and side reflectors are incorporated within the resonant structure to confine the acoustic energy under the IDT and increase the Q factor. In comparison to SAW, LVBAW requires fewer number of side reflectors to achieve the same amount of acoustic attenuation, reducing the device footprint.

FIG. 1 is a schematic of an oscillator circuit example 101 that uses a MEMS acoustic wave resonator 100 that is designed to operate as a laterally vibrating bulk acoustic wave resonator. In this example, oscillator circuit 101 is implemented on a semiconductor substrate using complimentary metal-oxide semiconductor (CMOS) transistors, for example. In this example, current sources I1, I2 provide a constant current to cross coupled differential pair PMOS transistors M1, M2 and cross coupled differential pair NMOS transistors M3, M4. MEMS acoustic wave resonator 100 acts as an L-C tank circuit. NMOS transistors M5, M6, and capacitor C1 may be needed to reduce gain at low frequencies. MEMS acoustic wave resonator 100 may look like a capacitor at low frequency, but it looks like an open circuit at DC (direct current), and the circuit might actually latch without the aid of transistors M5, M6.

LVBAW resonator 100 includes a piezoelectric material with an interdigital transducer (IDT) and side reflectors on one surface with a lower metal layer that works as a floating plate. An active area of the piezoelectric material is acoustically isolated from the surrounding medium. MEMS acoustic wave resonator devices using piezoelectric films with thicknesses ranging from several micrometers down to tenths of nanometers resonate in the frequency range of roughly 100 MHz to 10 GHz. Aluminum nitride and zinc oxide are two examples of piezoelectric materials in MEMS acoustic wave resonators.

In this example, LVBAW resonator 100 is implemented on a semiconductor substrate that is separate from the semiconductor substrate on which oscillator circuit 101 is fabricated. LVBAW resonator 100 may be mounted on the CMOS oscillator chip. Bond wires may be used to connect MEMS resonator terminals 101, 102 to bond pads on the CMOS oscillator chip. In another example, a MEMS acoustic wave resonator similar to LVBAW resonator 100 may be fabricated on the same substrate that includes an oscillator circuit.

Figure 2:
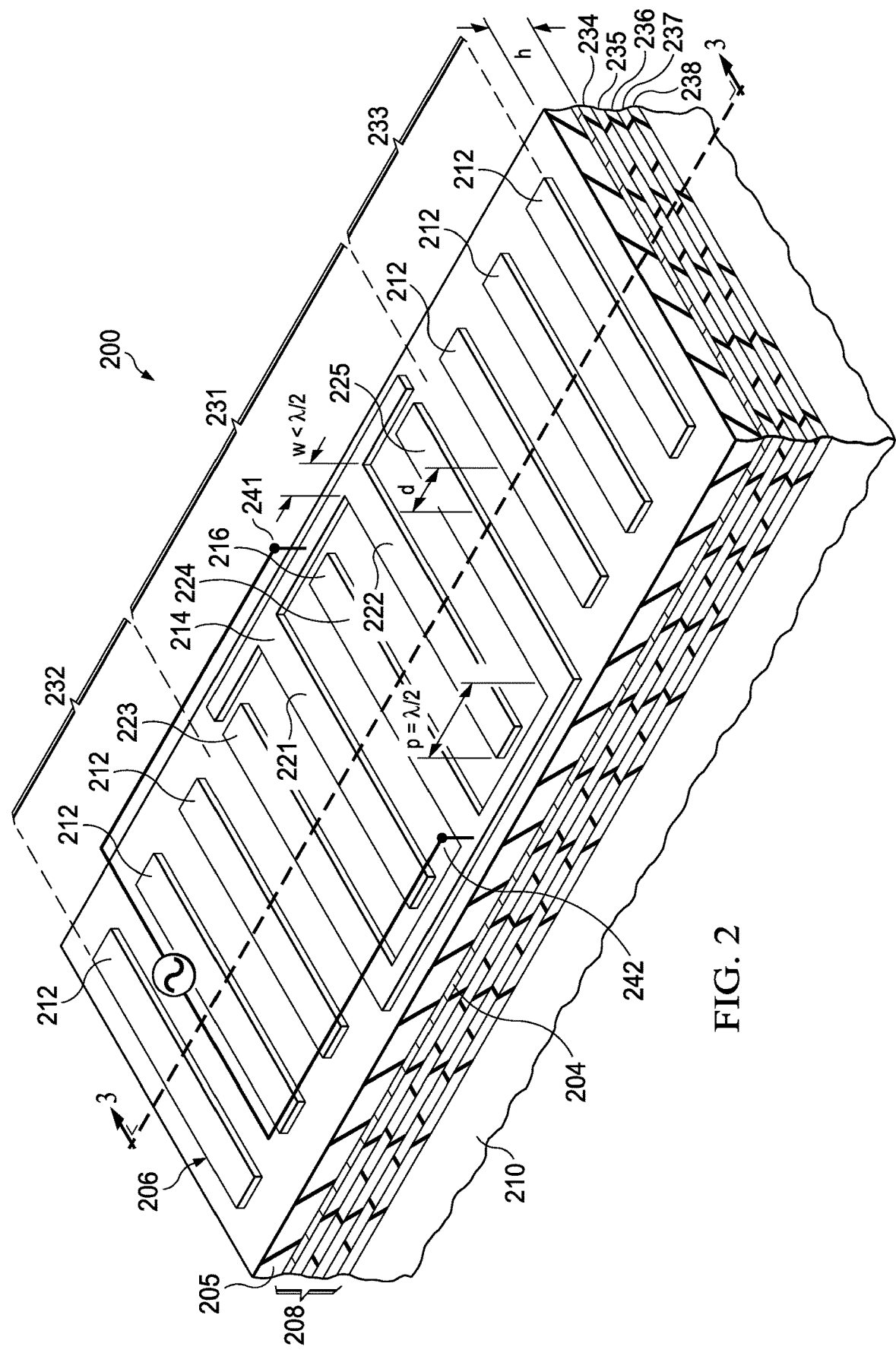
FIG. 2 is a cross-sectional side view of an example laterally vibrating BAW resonator having a bottom Bragg mirror.

FIG. 2 is a cross-sectional side view of an example laterally vibrating BAW resonator 200 having a bottom Bragg mirror 208. LVBAW resonator 200 includes an upper metal layer 206 that is patterned into an interdigital transducer (IDT) 231 that includes electrodes 214 and 216, and a lower metal layer 204. Upper metal layer 206 and lower metal layer 204 are separated by a piezoelectric plate 205. LVBAW resonator 200 may be fabricated directly on substrate 210 using known or later developed semiconductor fabrication techniques. Set 232, 233 of side reflectors 212 are arranged on both sides of IDT 231. The term "side reflectors" herein refers to the composite structures formed at both sides of the electrodes by combination of bottom metal, piezoelectric material and top metal layers, which result into low acoustic impedance regions. The side reflectors alternate high acoustic impedance regions formed by bottom metal and piezoelectric material layers. The goal of these side reflectors is to reduce the lateral leakage of energy at a target resonance frequency and improve the quality factor (Q). The terms "strip reflectors," "side reflectors," and "reflectors" used herein also refer to the same type structure to reduce the lateral dispersion of energy at a target resonant frequency.

Electrode 214 is patterned into a comb-shaped structure that has several parallel "fingers" 221, 222. Electrode 216 is similarly patterned into a comb-shaped structure that has several parallel fingers 223, 224, 225 that are interlocked with the fingers of electrode 214. In this example, electrode 214 has two fingers 221, 222 and electrode 216 has three fingers 223, 224, 225. In another example, there may be fewer fingers, such as one finger interlocked with two fingers. In another example, there may be more fingers in each electrode.

Each finger has a width (w) that is selected to be less than one half of a wavelength (y) of a target resonance frequency of a signal that is propagating laterally in piezoelectric layer 205, such that $w<\lambda/2$. The spacing between the fingers is selected to have a finger to finger pitch (p) equal to one half of the resonant frequency wavelength, such that $p=\lambda/2$. The electrode width can vary in different examples and is only restricted by the electrode pitch. However, when w becomes closer to p the performance gets worse and it is not practical to have electrodes of different polarities almost touching each other.

As described in more detail hereinbelow, to achieve a low-dispersive $S_0$-mode of operation, the thickness (h) of the piezoelectric plate 205 together with the electrode metals 204, 206 is reduced to less than one half the electrode pitch (p), such that $h<\lambda/4$. In this example, $h=0.75\lambda/4$. In another example, the thickness of piezoelectric plate 205 and the upper and lower metal layers may be selected such that $h<0.75\lambda/4$.

In this example, LVBAW resonator 200 uses an acoustic reflector 208 at the bottom to prevent acoustic energy that propagates in the vertical direction from leaking into substrate 210. In some examples, a second acoustic reflector may be located on top of upper metal layer 206 to isolate the resonator from any other material or specimen that could be in direct contact with its top surface.

In laterally vibrating BAW resonators, the resonance frequency exhibits a low-dispersive S0 mode of vibration primary dominated by a lateral displacement component that shows large acoustic propagation in the lateral direction. As a result, this lateral energy leakage can affect the resonator quality factor (Q), which is defined as the ratio of energy stored over the energy lost per cycle of vibration. In the case of small devices, the energy lost becomes dominated by acoustic losses.

Patterned side reflectors 232 placed on one side of IDT 231 and patterned side reflectors 233 placed on an opposite side of IDT 231 mitigate the amount of lateral acoustic energy leakage. For efficient energy confinement, the width and separation of the metal strip lines 212 forming the resonant confiners 232, 233 is selected to be $\lambda/4$, where $\lambda$ represents the lateral wavelength of the propagating acoustic wave leaving the resonator at resonance frequency. The reflectors are placed within the area of vibration, which is delimited by the Bragg mirror 208. The metal strip lines 212 are electrically isolated from each other.

The number of strip reflectors 212 can be increased up to the point in which the lateral displacement becomes highly attenuated, minimizing the amount of energy leakage and improving Q. While only three strips 212 are illustrated on each side of IDT 231, an example LVBAW may include ten to twenty, or more, strip reflectors.

In this example, lower metal layer 204 and electrodes 214, 216 and side reflectors 212 are patterned from layers of metal, such as Al, Mo, Cu, Au, etc. Piezoelectric layer 205 is fabricated using various piezo materials, such as AlN, quartz, GaN, ZnO, lithium nobate, etc. A temperature compensating layer of oxide may be formed on top of piezoelectric layer 205, or any position in between the resonator stack. Oscillator terminals 241, 242 are coupled electrodes 214, 216 respectively and thereby provide contacts for coupling LVBAW resonator 200 to an oscillator circuit 240 to form a signal at the resonant frequency of LVBAW 200.

In this example, acoustic reflector 208 is a distributed Bragg reflector (DBR). A DBR is a structure formed from multiple layers of alternating materials with varying acoustic impedance. Each layer boundary causes a partial reflection of an acoustic wave. For bulk acoustic waves whose wavelength is close to four times the thickness of the layers, the many reflections combine with constructive interference, and the layers act as a high-quality reflector. Any known or later developed Bragg mirror, dielectric mirror, acoustic reflector, etc. may be used to implement the acoustic reflector 208. The example acoustic reflector 208 includes alternating layers of materials with different acoustic impedances. In some examples, acoustic reflector 208 includes: (a) alternating flat conductive members (e.g., layers, sheets, plates, etc. of metal), two of which are designated by reference numerals 235 and 237; and (b) flat dielectric members (e.g., layers, sheets, plates, etc. of a dielectric material), three of which are designated by reference numerals 234, 236, and 238. The thicknesses of and distances between the conductive members 235 and 237 are selected based on an intended resonance frequency of the LVBAW resonator 200. As a result, the acoustic reflector 208 reduces spurious modes, and it confines (such as by reflecting, directing, containing, etc.) acoustic energy of the main mode at that frequency in piezoelectric layer 205. In some examples, the conductive members 235, 237 are formed by tungsten (W), titanium tungsten (TiW) or copper (Cu). In some examples, the dielectric members 234, 236, 238 are formed by silicon dioxide (SiO2), or a carbon doped oxide dielectric (such as SiCOH), or aluminum nitride (AlN). In some examples, the acoustic reflector 208 may be implemented using a two-dimensional (2D) or a three-dimensional phononic crystal. Lower metal layer 204 may be formed in contact with the adjacent Bragg mirror 208.

In one example, substrate 210 may include Si and may be between 275 nm and 925 nm in thickness depending on the wafer diameter. The acoustic Bragg mirror 208 includes alternating layers of SiO2 and TiW in order to achieve high acoustic impedance mismatch, and each layer may be between 10 to 1000 nm in thickness as a result of being one quarter wavelength of the acoustic modes excited by the LVBAW at resonance. The bottom metal layer 204 may include Mo or Pt and its thickness may be between 10 to 1000 nm. The piezoelectric plate 205 may include AlN or doped-AlN and its thickness may be between 50 to 5000 nm. The top metal layer 206 (including, for example, the fingers 212) may include Mo or Pt and its thickness may be between 10 to 1000 nm. The thicknesses of the bottom metal layer 204, piezoelectric plate 205, and top metal layer 206 are designed to be less than one fourth the wavelength at the acoustic phase velocity of the LVBAW resonance frequency.

Figure 3:
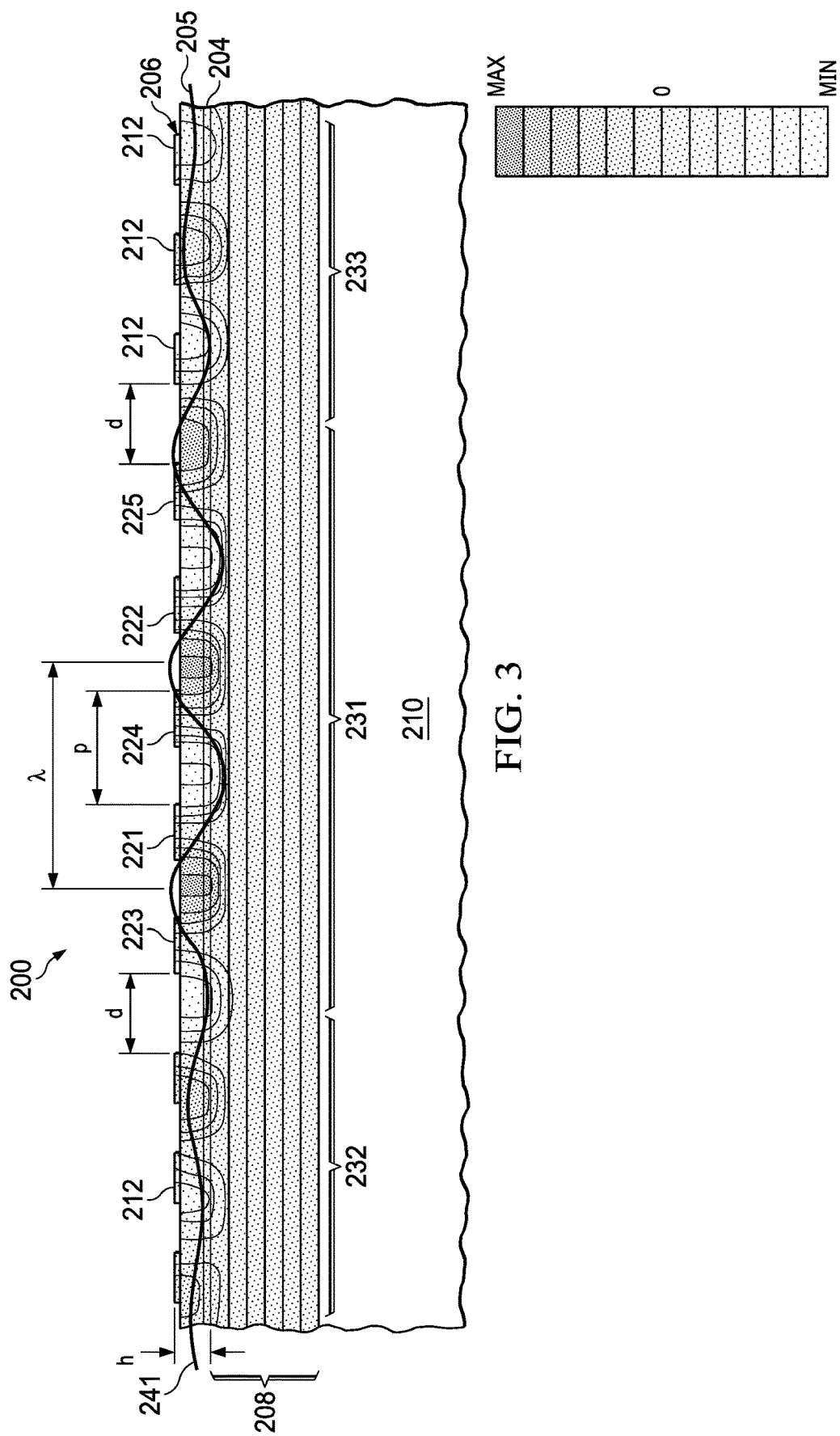
FIG. 3 is a plot illustrating amplitude of lateral displacement in the laterally vibrating MEMS resonator of FIG. 2.

FIG. 3 is a plot illustrating amplitude of lateral displacement in the LVBAW resonator 200 of FIG. 2, which is confined primarily to the piezoelectric layer 205 and upper and lower metal layers 206, 204 respectively by Bragg mirror 208. Plot line 241 and respective shading represent the magnitude of lateral displacement in LVBAW resonator 200. Both CMR and LVBAW resonators exhibit the same low-dispersive $S_0$-mode of vibration whose resonance frequency depends on the longitudinal acoustic velocity of the piezoelectric stack and electrode pitch. However, CMRs require a fully-released metal-piezoelectric-metal structure to confine the acoustic energy while LVBAW 200 relies on the energy confinement capabilities of acoustic BM 208 and metal side reflectors 232, 233. To reduce the energy leakage at resonance, BM 208 is designed to suppress the shear and thickness propagating waves while the width and separation of the metal side reflectors are selected to be equivalent to $\lambda/4$ of the lateral propagating wave of the target resonance frequency.

Figure 4:
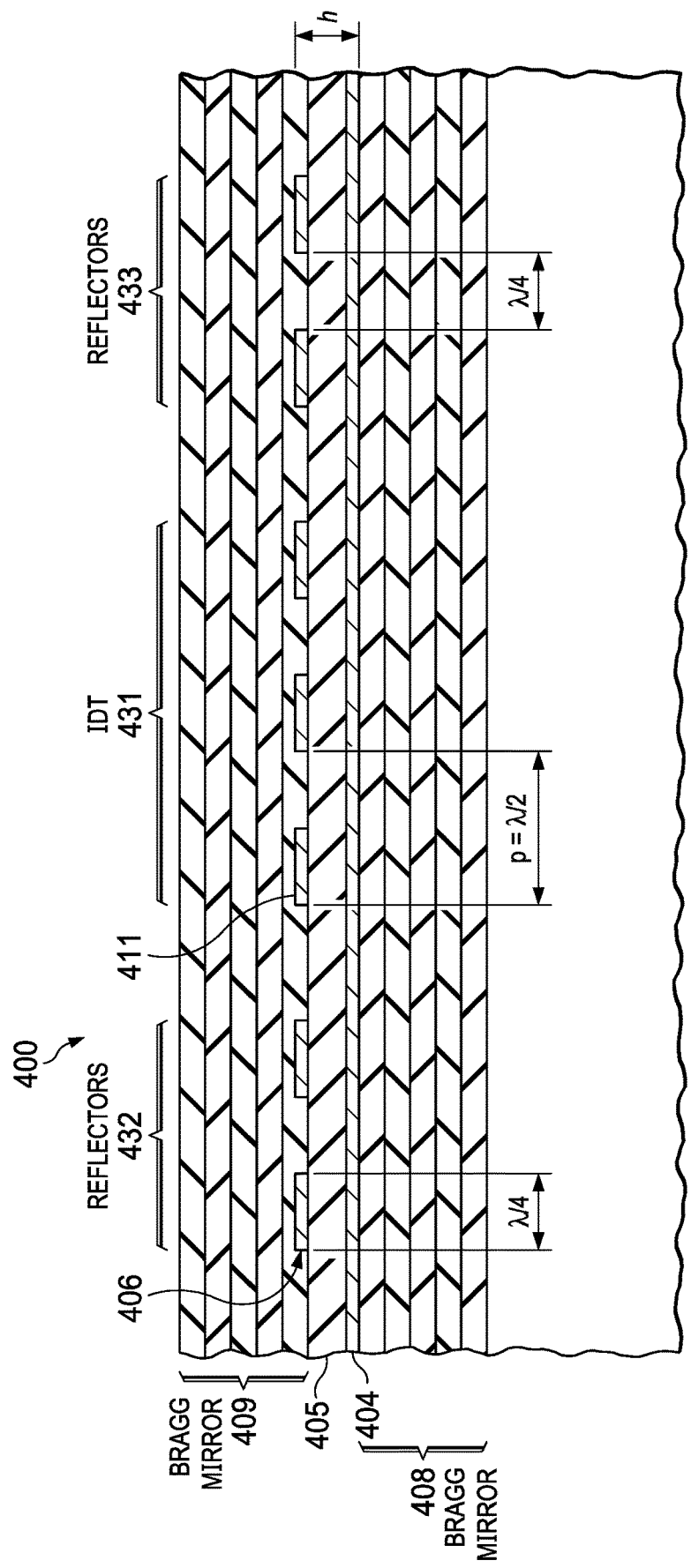
FIG. 4 is a cross-sectional side view of an example laterally vibrating BAW resonator that includes a top and a bottom Bragg mirror.

FIG. 4 is a cross-sectional side view of an example laterally vibrating BAW resonator 400 that includes a bottom Bragg mirror 408 and a top Bragg mirror 409. LVBAW 400 is similar to LVBAW 200 (FIG. 2) with the addition of top Bragg mirror 409 to improve confinement of main mode acoustic energy. Bragg mirrors 408, 409 are constructed in a similar manner to acoustic mirror 208 (FIG. 2). In this manner, the quality factor (Q) of the MEMS acoustic wave resonator 400 is increased and, in turn, the performance of a system including the example MEMS acoustic wave resonator 400 is improved.

In this example, only three microstrip fingers 421 within IDT 431 are illustrated for simplicity, and only a portion of side reflectors 432, 433 is illustrated for simplicity.

Figure 5:
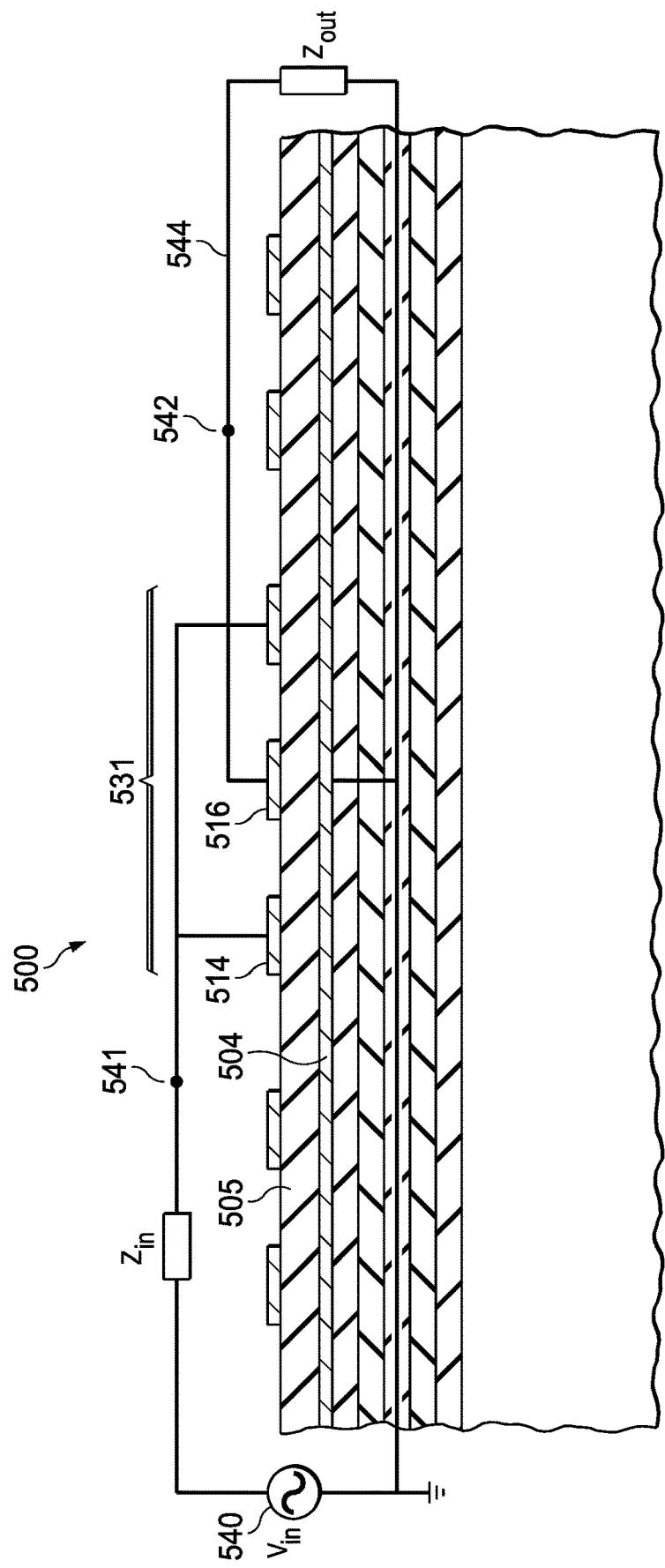
FIG. 5 illustrates electrical connections for a 2-port configuration of an example laterally vibrating BAW resonator with interdigital transducer.

FIG. 5 illustrates electrical connections for a 2-port configuration of an example laterally vibrating BAW resonator 500 with interdigital transducer 531 formed on the top side of piezoelectric layer 505 and lower metal layer 504. In this example LVBAW resonator 500 is similar to LVBAW 200 (FIG. 2).

Lower metal layer 504 acts as a ground plate in this example. An input port 540 is coupled to first signal terminal 541 and thereby to electrode 514 of IDT 531 and to ground plate 504. An output port 544 is coupled to second signal terminal 542 and thereby to electrode 516 of IDT 531 and to ground plate 504.

Figure 6:
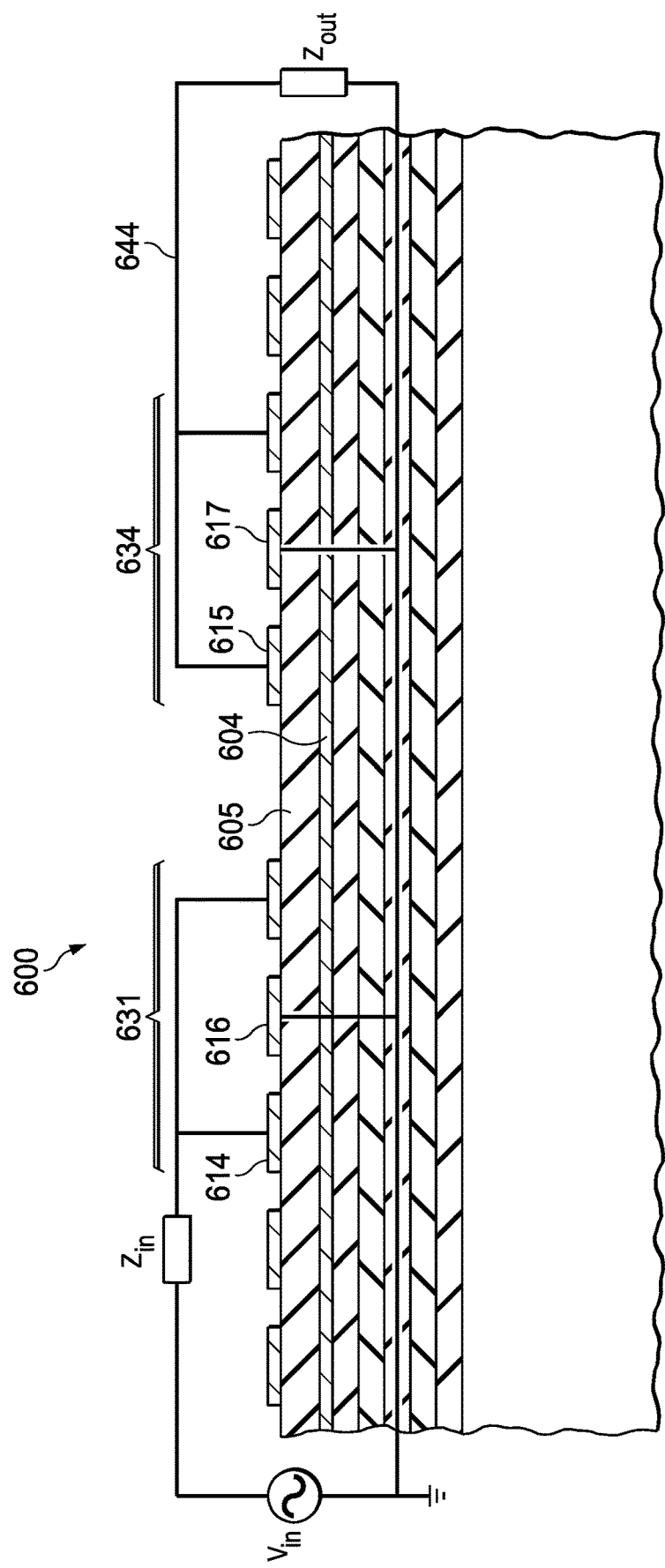
FIG. 6 illustrates electrical connections for a 2-port configuration of an example laterally vibrating BAW delay line that has isolated interdigital transducers.

FIG. 6 illustrates electrical connections for a 2-port configuration of an example acoustic delay line formed by input and output laterally vibrating BAW devices 600 that has isolated interdigital transducers 631, 634 formed on the top side of piezoelectric layer 605 and lower metal layer 604. In this example LVBAW delay line 600 is similar to LVBAW 200 (FIG. 2) with the addition of a second IDT electrically isolated from the first IDT.

Lower metal layer 604 acts as a floating plate in this example. An input port 640 is coupled to electrode 614 of IDT 631 and to electrode 616. An output port 644 is coupled to electrode 615 of IDT 634 and to electrode 617.

In this example, lateral vibration emanating from IDT 631 couples to IDT 634 to produce an output signal at port 644.

Figure 7:
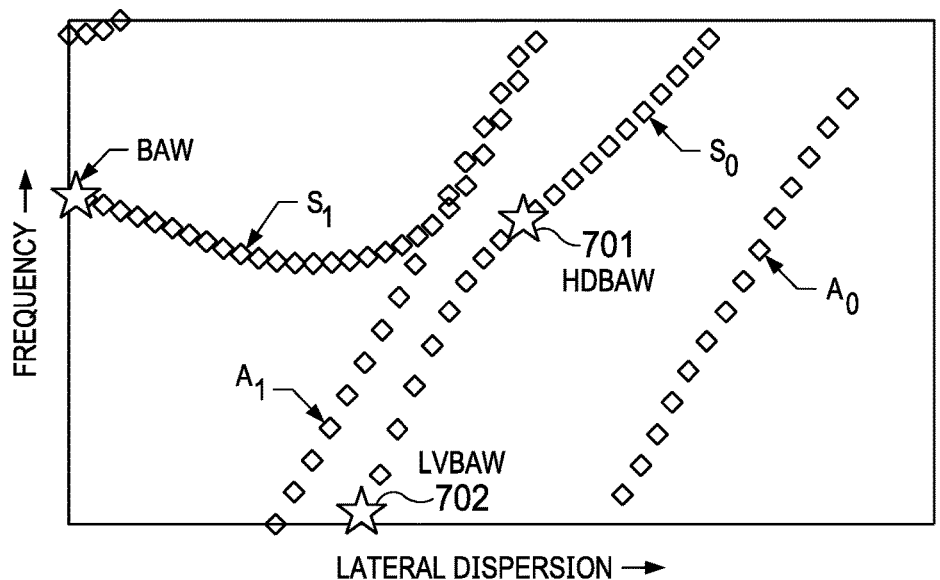
FIG. 7 is a plot of dispersion characteristics for various modes of resonator operation.

FIG. 7 is a plot of dispersion characteristics for various modes of resonator operation. Dispersion curves illustrate relationships between wave velocity, wavelength and frequency in a given infinite plate. In this example, frequency vs lateral dispersion within a piezoelectric stack of a MEMS resonator is illustrated. Rayleigh waves propagate along single free surfaces, while the particle motion in Lamb waves is elliptical with its x and z components depending on the depth within the plate. In one family of modes, the motion in Lamb waves is symmetrical about the midthickness plane. In another family it is antisymmetric. The elliptical particle motion is mainly in the plane of the plate for the symmetrical, extensional mode and perpendicular to the plane of the plate for the anti symmetric, flexural mode. These characteristics change at higher frequencies.

The A0 plot corresponds to the zeroth-order antisymmetric mode. The other dotted plot lines represent other modes of vibration that are possible within the simulated regions. For example, plot line S0 represents the zeroth-order symmetrical mode, while plot line S1 represents the first-order symmetrical mode. The A1 plot corresponds to the first-order antisymmetric mode of known modes of acoustic vibration that are possible in the simulated stack-up of materials.

Each mode of vibration has a characteristic mode shape that allows the type of vibration to be identified. For a given structure, the size, shape and various constraints on the structure will cause a particular mode of vibration to dominate. Referring again to FIG. 3, the shape of the simulated vibration illustrated therein is characteristic of a zeroth-order symmetric mode of vibration. This indicates that acoustic waves propagating in the substrate of LVBAW device 200 are using a zeroth-order symmetric mode of vibration.

An alternative BAW architecture with a similar interdigitated transducer is described in more detail in U.S. patent application Ser. No. 16/236,601, entitled "Highly Dispersive Bulk Acoustic Wave Resonators." Highly-dispersive BAW (HDBAW) resonators show some lithographic tunability, but their resonance frequency (or wavelength, λ) is a function of the electrode width (w) and the equivalent thickness of the vibrating piezoelectric layer (h). Consequently, the range of frequency tunability that can be achieved with HDBAW is limited to h, resulting in a disadvantage with respect to LVBAW, whose resonance frequency is primarily set by the electrode pitch (p) and the design of BMs, as described in more detail hereinbelow. In relation to the mode of vibration, HDBAW exhibits a highly-dispersive $S_0$ Lamb wave as indicated at 701, while LVBAW exhibits a low-dispersive $S_0$ Lamb wave, as indicated at 702. Moreover, LVBAW resonators with the same number of IDTs, Q and driving power display a stronger lateral displacement in comparison to HDBAW devices, which makes the LVBAW resonators better candidates to be used as acoustic delay lines, strain sensors or distributed bandpass filters.

To achieve a low-dispersive $S_0$-mode (LVBAW) instead of a highly-dispersive $S_0$-mode (HDBAW), the thickness of the piezoelectric plate and electrode metals (h) is reduced to less than one half the electrode pitch (p). λ/4 metal strip reflectors are included besides the IDTs in order to confine the lateral propagating energy. LVBAW resonator has a wider lithographic tunability than HDBAW, but this frequency range is ultimately limited by the design of BMs, which work as λ/4 transformers of the shear and thickness modes.

Figure 8:
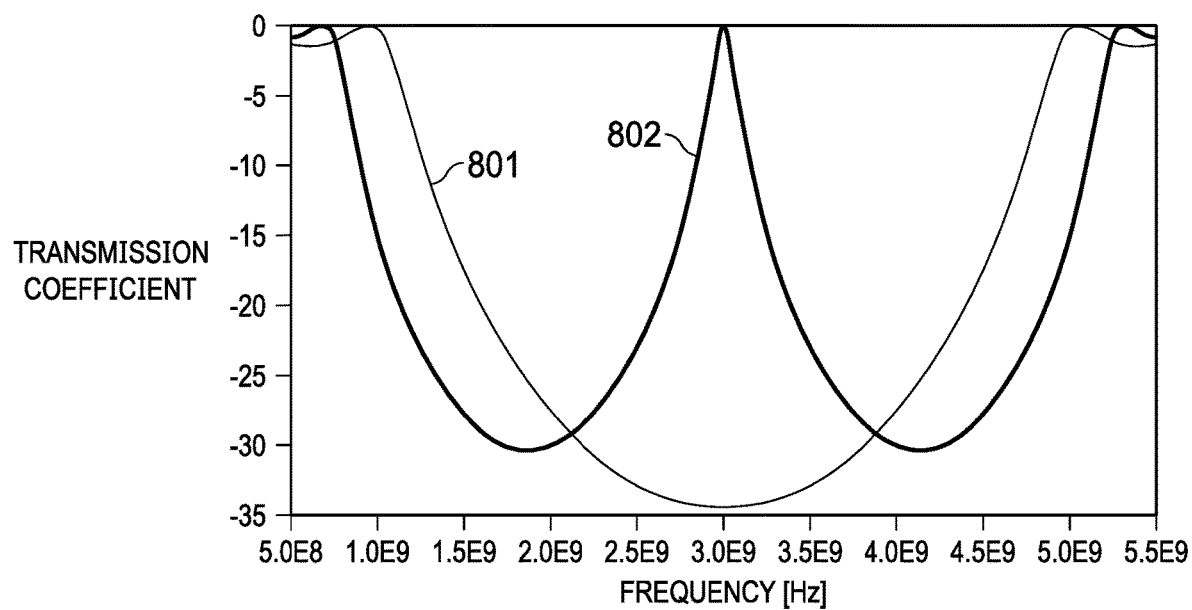
FIG. 8 is plot of transmission coefficients for two different example Bragg mirror designs.

FIG. 8 is a plot of transmission coefficients (T) for two different example Bragg mirror designs. In this example, the Bragg mirror is formed by SiO2-TiW-SiO2-TiW—SiO2 layers. Plot line 801 corresponds to a BM design in which all the layers behave as λ/4 transformers centered at 3 GHz and therefore produces a minimal transmission coefficient at approximately 3 GHz. Plot line 802 corresponds to a BM design in which the $SiO_2$ and TiW layers behave as λ/4 transformers centered at 1.5 GHz and 3.0 GHz, respectively. In this case, a resultant transmission coefficient minimum (max reflection) occurs at approximately 1.75 GHz and also at approximately 4.25 GHz. Table 1 presents the design parameters for these two example Bragg mirrors. These results demonstrate that the design of a BM can cover different regions of the spectrum and thus increase the effective frequency tunability of an example LVBAW resonator required for specific applications.

TABLE 1

Example parameters for λ/4 transformers

| layer | Plot line 801 | | Plot line 802 | |
|---|---|---|---|---|
| | Freq (GHz) | Thickness (nm) | Freq (GHz) | Thickness (nm) |
| 1 - $SiO_2$ | 3 | 486 | 1.5 | 972 |
| 2 - TiW | 3 | 433 | 3 | 433 |
| 3 - $SiO_2$ | 3 | 486 | 1.5 | 972 |
| 4 - TiW | 3 | 433 | 3 | 433 |
| 5 - $SiO_2$ | 3 | 486 | 1.5 | 972 |

For example, an LVBAW can be designed to operate at approximately 3 GHz using the Bragg mirror represented by plot line 801 and by selecting an electrode pitch corresponding to λ/2 at 3 GHz.

In another example, an LVBAW can be designed to operate at approximately 1.75 GHz using the Bragg mirror represented by plot line 802 and by selecting an electrode pitch corresponding to λ/2 at 1.75 GHz. Using the same Bragg mirror design represented by plot 802, a different LVBAW can be fabricated simultaneously using a different layout for the upper metal layer in which the electrode pitch corresponds to λ/2 at 4.25 GHz and the LVBAW would then operate at 4.25 GHz.

Figure 9:
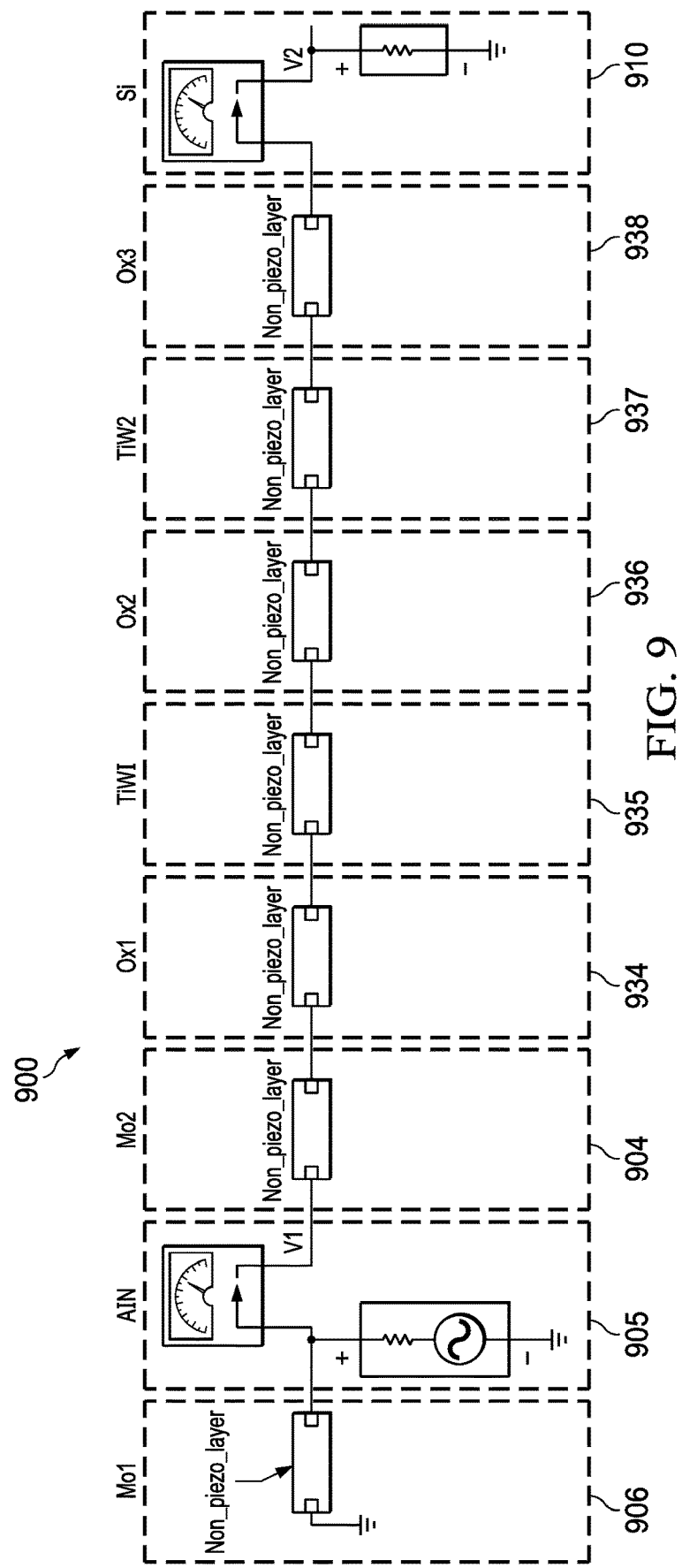
FIG. 9 illustrates an example simulation of a Bragg mirror.

FIG. 9 illustrates an example simulation of a Bragg mirror using known simulation techniques. This example represents an LVBAW similar in physical configuration to LVBAW 200 (FIG. 2). In this example, upper metal layer 906, lower metal layer 904, metallic BM layers 935, 936 and dielectric BM layers 934, 936, 938 are simulated as short transmission lines having a characteristic impedance that match a corresponding acoustic impedance of the physical layer of material. The acoustic impedance is determined by the type of material, its thickness, etc. Piezoelectric layer 905 is simulated as a voltage source operating at a selected frequency, while substrate 910 is simulated as an impedance load.

Using transmission line theory, reflections can be determined based on the characteristic impedance and varying frequencies to determine how the overall stack of layers performs as a Bragg mirror. Simulated layer thicknesses and type of materials can be changed to arrive at a design for a selected target frequency or range of frequencies.

Referring again to FIG. 2, set of side reflectors 232, 233 are placed in a region of LVBAW device 200 that is separated from IDT 231 by a distance (d). In this example there are three individual reflectors illustrated for clarity, such as reflectors 212, in the sets 232, 233. Another example may include more or fewer individual reflectors in a set of side reflectors. Patterned side reflectors 232, 233 are placed on each side of IDT 231 as a way to mitigate the amount of lateral acoustic energy leakage. For efficient energy confinement, the width (w) 533 and separation (s) 534 of the metal strip lines forming the side reflectors is selected to be λ/4, where λ represents the lateral wavelength of the propagating acoustic mode leaving the resonator at the resonance frequency. The side reflectors are located within the area of vibration, which is delimited by the Bragg mirror 2018. The reflector nearest to the IDT 231 is spaced apart from the perimeter of IDT 231 as given by expression (1), where n is an odd integer.

$$d = n \cdot \frac{\lambda}{4} + \frac{p-w}{2} \quad (1)$$

The side reflectors described herein are separated from the top electrode and their dimensions (linewidth and separation) are equivalent to λ/4. The thickness of the side reflectors can be the same as the thickness of the electrode. The side reflectors therefore can be fabricated with the same process steps that form the electrodes of IDT 231.

To achieve the displacement decay necessary to improve Q, the width and separation of the metal strip lines forming the reflectors need to be selected as one fourth of the periodicity of the propagating lateral wave (λ4). The λ value will change depending on the material composition of the propagation regions. Specifically, λ will be selected based on the acoustic velocity of the propagating wave in the piezoelectric stack as well as the resonance frequency value (λ=vp/fr). The periodicity will change based on the material properties of the stack where the wave will propagate through.

To determine the vp of each of the side reflectors, such as reflector 212, equivalent elastic modulus ($E_{eq}$) and mass density ($\rho_{eq}$) of the material stack forming each region of the side reflectors is calculated. The strip lines, such 531, will be formed by a block of material that includes a metal layer and all of the other layers that make up the substrate of MEMS device 200 and the non-metalized regions between each reflector will be formed by a second block of material that does not include a metal layer and all of the other layers that make up the substrate of MEMS device 200. The propagation velocity ($v_p$) will be determined as shown in expression (2).

$$v_p = \sqrt{\frac{E_{eq}}{\rho_{eq}}} \quad (2)$$

The relationship of longitudinal phase velocity ($V_l$) and resonance frequency ($f_r$) is given by expression (3).

$$f_r = \frac{V_l}{2p} \quad (3)$$

The resonator Q depends on the reflection coefficient (Γ) as shown in expression (4), where n is the number of electrodes and N is the number of pairs of reflectors. Γ is a function of the number of pairs of reflectors (N) and their acoustic impedance mismatch (r) as shown in expression (5). Acoustic impedance mismatch (r) is a function of acoustic impedance in metalized regions ($Z_m$) and in non-metalized regions (Z), as shown in expression (6).

$$Q = \frac{\pi}{1-\Gamma}\left(\frac{n}{2} + \frac{N}{4}\right) \quad (4)$$

$$\Gamma = \tanh(N|r|) \quad (5)$$

$$r = j\frac{Z_m - Z}{Z} \quad (6)$$

FIG. 10 is a plot illustrating reflection coefficient vs number of reflectors in example resonators. Plot line 1001 represents an LVBAW device, such as LVBAW 200 (FIG. 2) and illustrates reflection coefficient as a function of the number of reflectors. In this example, plot line 1001 represents an LVBAW device having 0.1 um thick Mo metal layers and an AlN piezoelectric layer that is 1.0 um thick. Plot line 1002 represents a SAW device having a layer of LiNbO3. Plot line 1003 represents a SAW device having a layer of 0.1 um thick Au over ST-X quartz.

In this example, plot line 1001 indicates a reflection coefficient of approximately 0.8 for the LVBAW device with 20 reflectors, while plot lines 1002, 1003 indicate reflection coefficients of less than 0.35 for the SAW devices with 20 reflectors. This means that the LVBAW can be physically smaller than a SAW device because fewer reflectors are required and therefore provide a higher Q for more efficient operation.

Figure 11A:
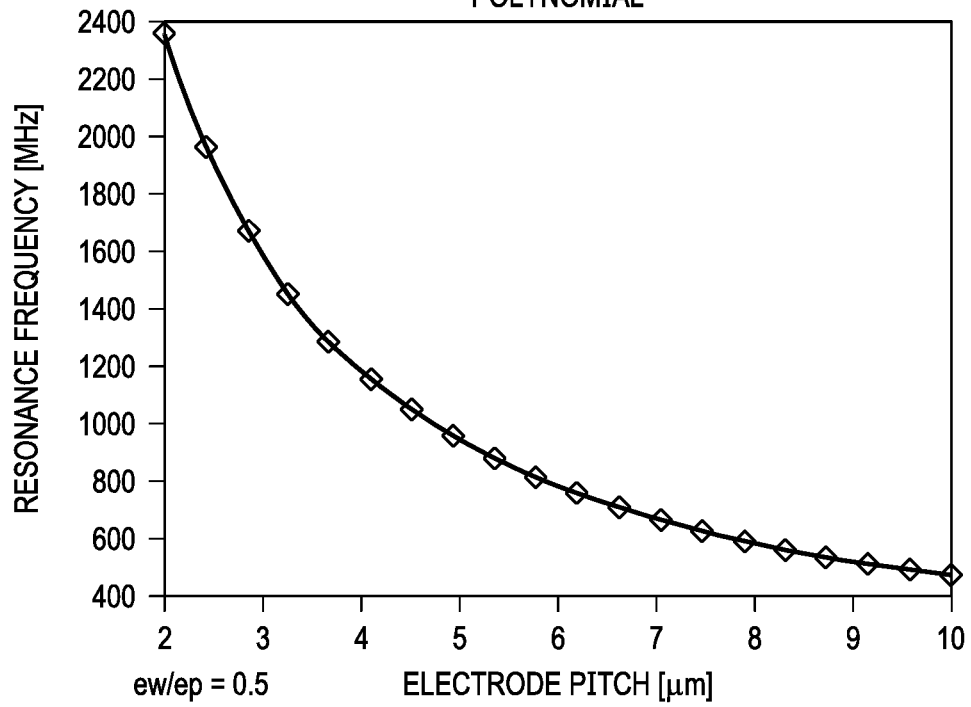
FIG. 11A is a plot of resonant frequency vs. electrode pitch
Figure 11B:
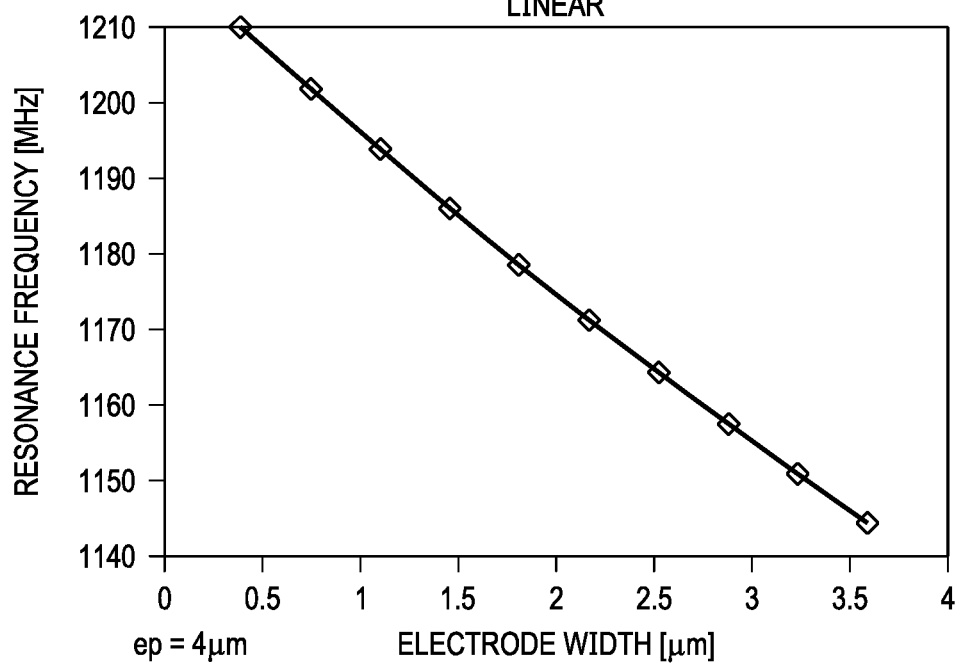
FIG. 11B is a plot of resonant frequency vs. electrode width for an example laterally vibrating BAW.

FIG. 11A is a plot of resonant frequency vs. electrode pitch (p) and FIG. 11B is a plot of resonant frequency vs. electrode width (w) for example LVBAW 400 (FIG. 4). In FIG. 11A, electrode pitch may be varied to achieve frequency reconfiguration. As shown in FIG. 11A, if the electrode pitch is changed (while not changing the electrode width), then the resonance frequency changes as a second-order polynomial. Likewise, as shown in FIG. 11B, if the electrode width is changed (while not changing the electrode pitch), then the resonance frequency changes linearly.

Figure 12:
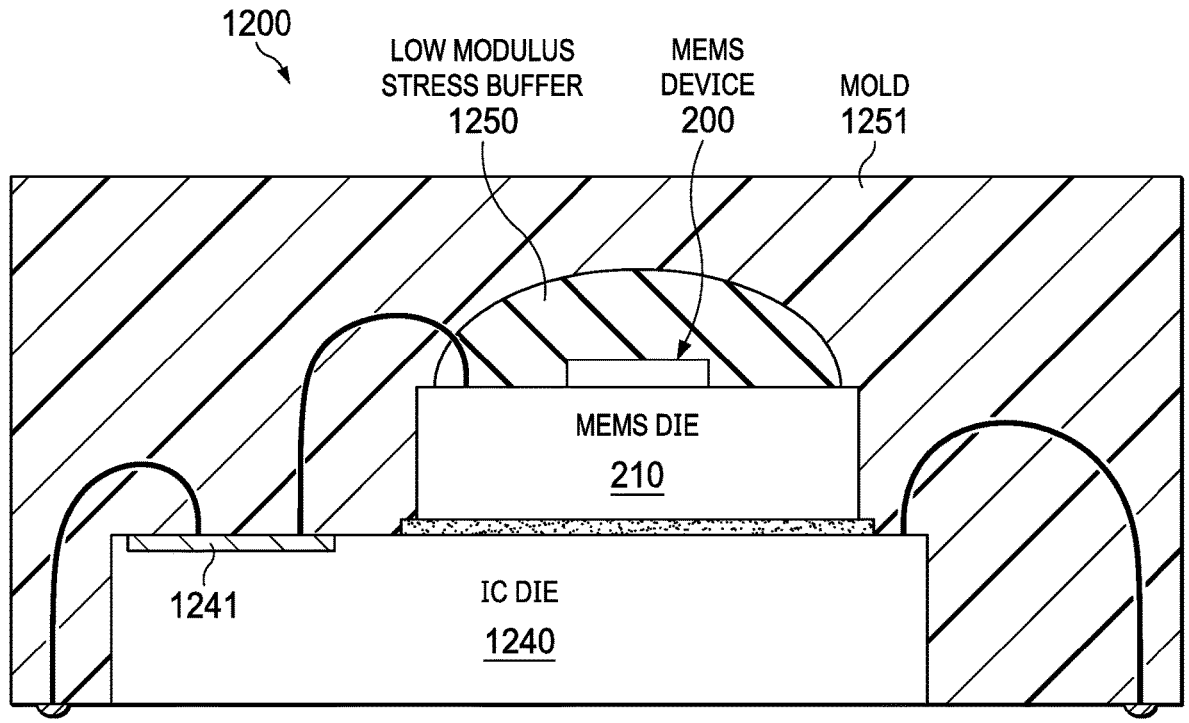
FIG. 12 is a cross sectional view of an example packaged integrated circuit that includes an example laterally vibrating BAW resonator.

FIG. 12 is a cross-sectional view of an example package integrated circuit 1200 that includes the example LVBAW resonator 200 of FIG. 2. IC die 1240 and MEMS die 200 are encapsulated with mold compound 1251, using a known or later developed encapsulation process.

In this example, a material 1250 that has a low modulus of elasticity may be placed over MEMS resonator 200 to prevent high modulus mold compound 1251 from touching LVBAW resonator 200. In this manner, low modulus material 1250 acts as a stress buffer and provides a stress-free structure for LVBAW resonator 200 within an encapsulated package 1200.

In another example, a protective "cavity wafer" or "hard hat" may be placed over LVBAW resonator 200 to prevent mold compound from touching LVBAW resonator 200. IC die 1240 and MEMS die 200 may then be encapsulated with mold compound using a known or later developed encapsulation process.

Figure 13:
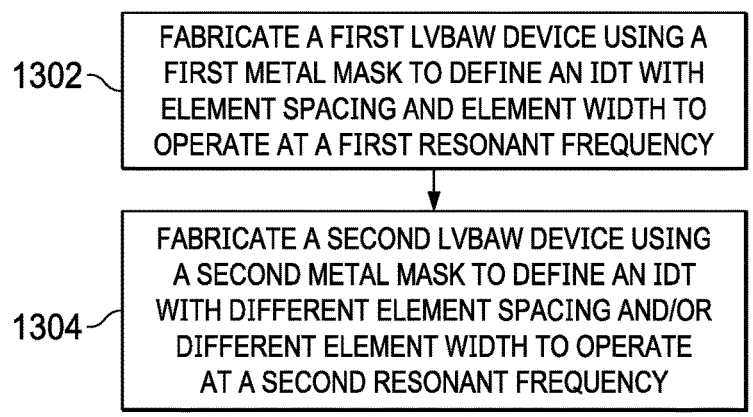
FIG. 13 is a flow chart illustrating operation of an example laterally vibrating BAW resonator device.

FIG. 13 is a flow chart illustrating a method of fabricating different LVBAW resonator devices, such as any of the MEMS devices 200, 400, 500, 600 described hereinabove. As described in more detail hereinabove, a LVBAW device is based on a piezoelectric plate sandwiched between metal layers and either a bottom Bragg mirror (BM) or both bottom and top BMs. The upper metal layer is patterned to form an interdigital transducer (IDT) and side reflectors while the lower metal can work as a non-electrified floating plate in a 1-port configuration or a ground plate in a 2-port configuration with a single IDT or isolated IDTs. The electrode pitch sets the LVBAW resonance frequency and that requires that the equivalent thickness of the laterally-vibrating film formed by the piezoelectric layer and electrode metals (h) is at least two times smaller than the electrode pitch. The acoustic BMs and side reflectors are incorporated within the resonant structure to confine the acoustic energy under the IDT and increase the Q factor.

Two or more versions of an LVBAW design can be made in which the only difference between the two versions is the pitch and or width of the elements of the IDT and side reflectors. This means that only a single metal mask may need to be changed to create an LVBAW that has a different resonant frequency.

Referring again to FIG. 8, an LVBAW may be designed in which the Bragg mirrors have two or more transmission coefficient minimal points. This allows different resonant frequencies to be produced by changing the pitch/width of the elements of the IDT.

At 1302, a first version of an LVBAW is fabricated using a first metal mask to define an IDT and side reflectors that have a first element spacing and element width that will cause the LVBAW to operate at a first resonant frequency. The various layers of the substrate, Bragg mirror, piezoelectric layer, lower metal layer and other interconnect layers are fabricated using appropriate masks and fabrication techniques.

At 1304, a second version of an LVBAW is fabricated in a second batch using a second metal mask to define an IDT and side reflectors that have a second element spacing and/or a second element width that will cause the LVBAW to operate at a second resonant frequency. In this case, all of the other processing steps and masks are the same as used in 1302.

In another example, a metal mask may be created for fabrication of a wafer of LVBAWs in which a portion of the LVBAWs on the wafer are fabricated using the first element spacing and width and another portion of the LVBAWs on the wafer are fabricated using the second element spacing and width. In this manner, LVBAWs that operate at different resonance frequencies may be fabricated simultaneously on the same wafer.

In an example, masks are used in a lithographic process to expose a photo resist on a metal layer, after which an etchant removes a portion of the metal layer using known fabrication techniques. In another example, the mask may be replaced by a direct write lithographic technique.

Figure 14:
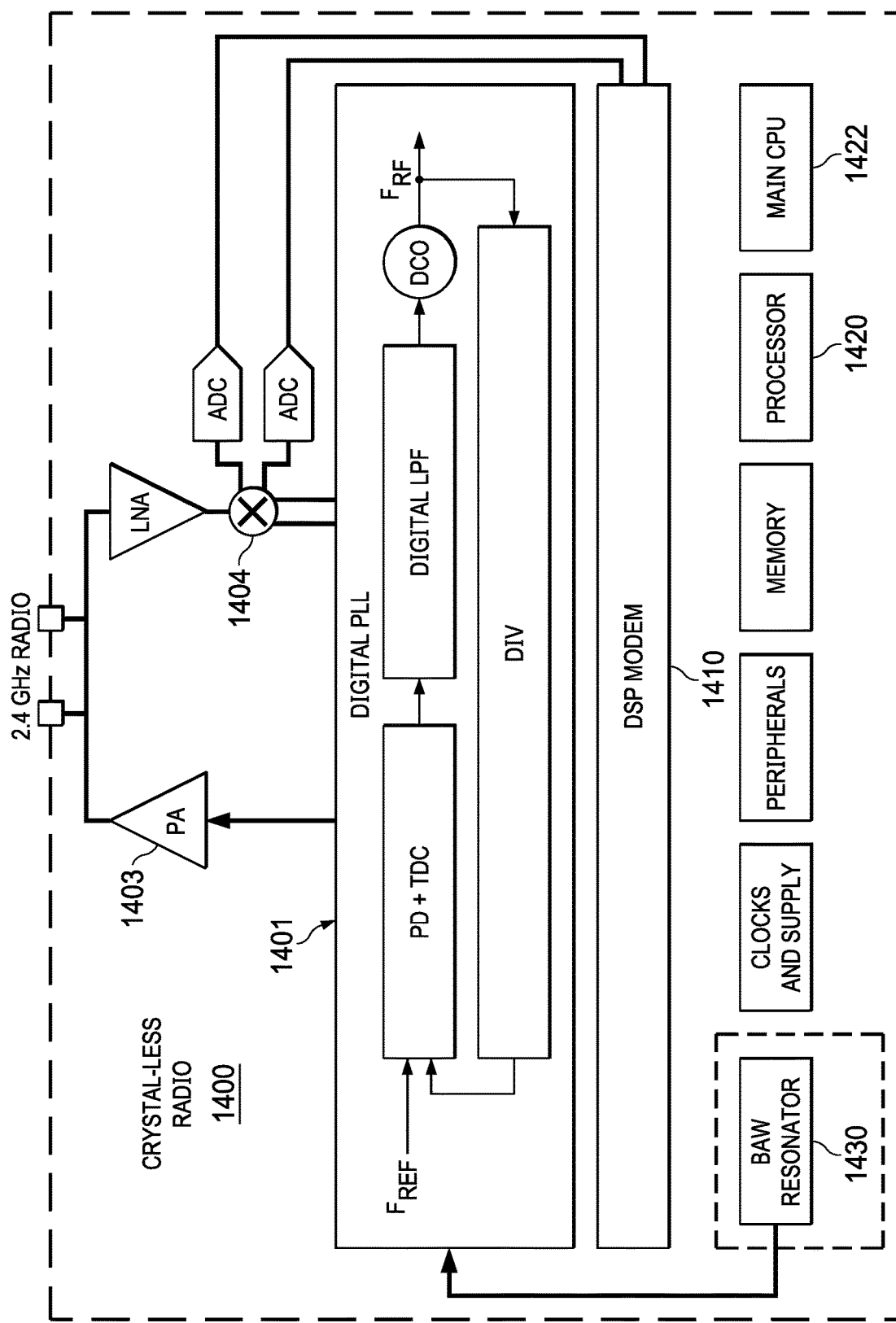
FIG. 14 is a block diagram of an example system-on-chip that includes of an example laterally vibrating BAW resonator.

FIG. 14 is a block diagram if an example system on chip (SoC) 1400 that includes an example LVBAW resonator 1430. In this example SoC 1400 is a wireless micro control unit (MCU) with a LVBAW resonator 1430 in a quad flat no-lead (QFN) package that provides a reduced overall footprint. Advantageously, use of LVBAW resonator 1430 eliminate the need for an external crystal to control the radio frequency (RF) signal for the 2.4 GHz radio transceiver and clock signals for processors 1420, 1422. In this example, LVBAW resonator 1430 is similar to LVBAW resonator 200 (FIG. 2). In another example, LVBAW resonator 1430 may be similar to LVBAW resonator 400 (FIG. 4), for example.

Digital phase locked loop (DPLL) 1401 uses a reference frequency signal provided by LVBAW resonator 1430 to generate an RF signal that is provided to power amplifier 1403 for wireless transmission of data produced by on-chip processor 1420 and/or 1422. RF receiver 1404 includes a low noise amplifier (LNA) that receives wireless signals. The received signals are then down-converted and digitalized using analog to digital converters (ADC) and then provided to DSP modem 1410. DSP modem 1410 extracts digital information from the received signals and provides the digital information to processor 1420 and/or main CPU 1422.

SoC 1400 is a low-power multi-standard device supporting Zigbee, Thread, Bluetooth Low Energy, and proprietary 2.4-GHz connectivity on a single chip. Enabling more design options and flexibility in a wider range of applications and environments, SoC 1400 is designed to work in the full −40° C. to 85° C. temperature range, unlike many crystal-based solutions.

Figure 15:
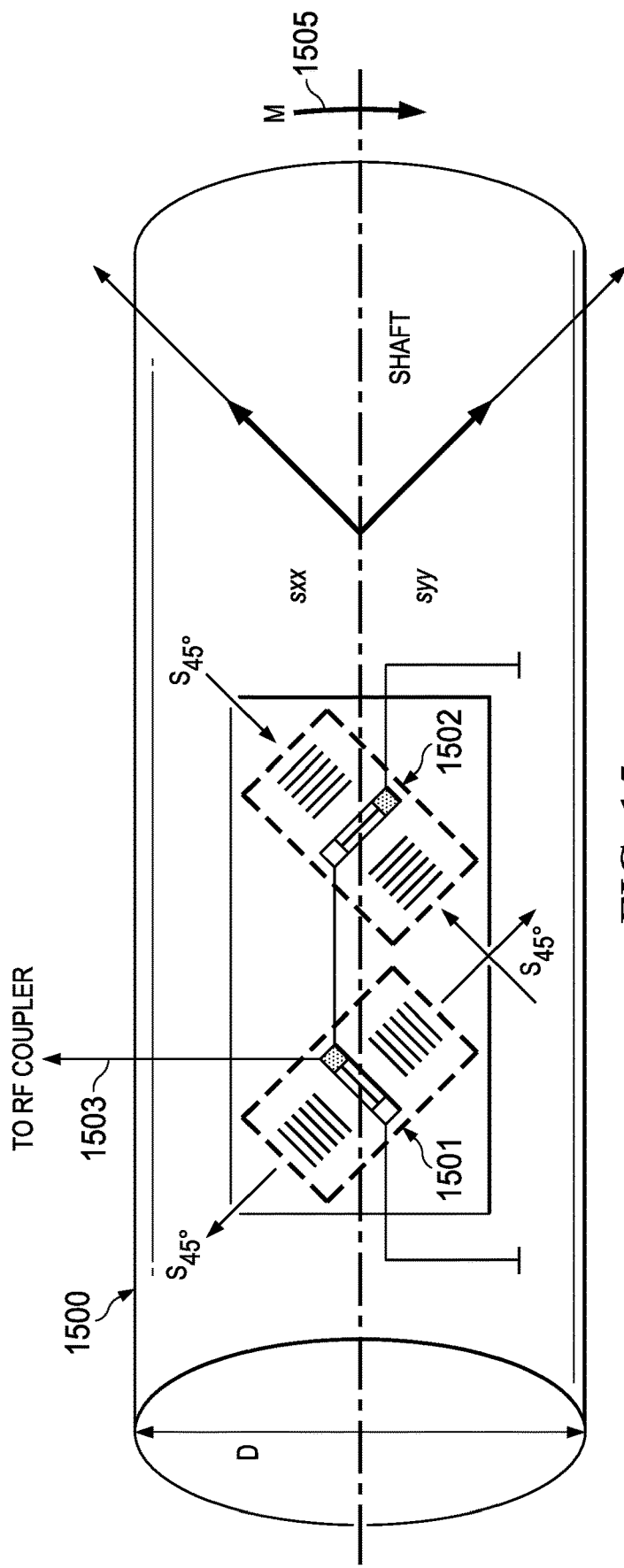
FIG. 15 is schematic illustrating use of an example laterally vibrating BAW to detect mechanical flexure.

FIG. 15 is schematic illustrating use of an example laterally vibrating BAW to detect mechanical flexure. In this example, a shaft 1500 that has a diameter D has a two LVBAW resonators 1501, 1502 rigidly mounted on the surface of the shaft, such that any mechanical deflection of shaft 1500 will cause LVBAW 1501 and/or 1502 to elongate or compress in response to the strain of shaft 1500. LVBAW resonator 1501 is mounted at a 45-degree angle to the axis of shaft 1500. In this example, LVBAW resonator 1502 is mounted perpendicular to LVBAW 1501 and at a 45-degree angle to the axis of shaft 1500. Signal line 1503 is coupled to the IDT in both LVBAW resonators 1501, 1502 and is coupled to an oscillator circuit (not shown). In another example, a single LVBAW resonator may be used, or additional LVBAW resonators may be used for additional coverage or more accuracy.

As described hereinabove with reference to FIGS. 11A, 11B and elsewhere herein, the resonance frequency of LVBAW resonators 1501, 1502 is determined by the pitch and width of the elements of the respective IDT and side reflectors within each LVBAW device. When shaft 1500 deflects due to a torque or moment force (M) 1505 applied to the shaft, the physical size of LVBAW devices 1501, 1502 will expand or contract because they are rigidly mounted to shaft 1500. These induced changes in physical size of LVBAW devices 1501, 1502 due to strain caused by torque 1505 will cause the electrode pitch and width of the IDT and side reflector elements to also change. In this manner, the combined resonance frequency LVBAW resonators 1501, 1502 will change in response to the amplitude of torque 1505. In an example, a resonance frequency sensitivity of 3.5 kHz/Nm was observed, where torque 1505 is measured in Newton-meters (Nm) and the LVBAW resonators are attached to the surface of a solid steel shaft of 20 mm diameter.

In another example, a stress force may be applied to an LVBAW resonator to cause deformation of the LVBAW resonator. A change if resonance frequency in response to the stress force can be determined. In this manner, a measure of the stress force can be determined by detecting a difference in resonance frequency between the stressed and unstressed LVBAW resonator.

OTHER EMBODIMENTS

In described examples, a single LVBAW resonator is mounted on a substrate, but in other examples there may be two or more LVBAW resonators mounted on one or more substrates.

A target width for elements of the side reflector elements equal to $\lambda/4$ of resonance frequency in the metalized region and space between elements equal to $\lambda/4$ of resonance frequency in the non-metalized region is calculated as described herein, but acceptable operation may be obtained within a range of +/−10% of the calculated values. As used herein, the terms "$\lambda/4$" and one fourth the wavelength" includes +/−10% $\lambda/4$. Similarly, the terms "$\lambda/2$" and "one half the wavelength" includes +/−10% $\lambda/2$. Devices designed to operate at a higher or at a lower target frequency will have side reflector parameters selected to match the target frequency.

The width and pitch of the interlocking fingers of the IDT may vary due to normal manufacturing tolerance. In some examples, a variation in width and/or pitch of the interlocking fingers may be in a range of +/−10%.

The example IC package 1200 of FIG. 12 is a surface mount device with multiple contacts on a bottom side of the package. However, in other examples, the IC package may be any of a number of known or later developed configurations, and may have various form, material(s), shapes, dimension(s), number of contacts, shape of contacts, etc. Moreover, the LVBAW resonator(s) and/or any other components may be packaged, mounted, etc. in the IC package in various configurations. Other example IC packages may be a wafer-level package or a die-level package.

Many devices are encapsulated with an epoxy plastic that provides adequate protection of the semiconductor devices and mechanical strength to support the leads and handling of the package. Some integrated circuits have no-lead packages, such as quad-flat no-leads (QFN) and dual-flat no-leads (DFN) devices, which physically and electrically couple integrated circuits to printed circuit boards. Flat no-lead devices, also known as micro leadframe (MLF) and small outline no-leads (SON) devices, are based on a surface-mount technology that connects integrated circuits to the surfaces of printed circuit boards without through-holes in the printed circuit boards. Perimeter lands on the package provide electrical coupling to the printed circuit board. Another example may include packages that are entirely encased in mold compound, such as a dual inline package (DIP).

In this description, the term "couple" and derivatives thereof mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Modifications are possible in the described embodiments, and other embodiments are possible, within the scope of the claims.

What is claimed is:

1. A microelectromechanical system (MEMS) device comprising:
   a laterally vibrating bulk acoustic wave (LVBAW) resonator, the LVBAW resonator comprising:
      a substrate;
      a first reflector on a portion of the substrate;
      a first metal layer on a portion of the first reflector;
      a piezoelectric layer on the first metal layer; and
      a second metal layer on a portion of the piezoelectric layer, the second metal layer including:
         an interdigital transducer (IDT) including a comb-shaped electrode, the comb-shaped electrode having fingers; and
         a second reflector on a side of the IDT, the second reflector being spaced from the IDT by a distance based on a sum of first and second terms, the first term is a product of an odd integer and a quarter of a wavelength of a signal having a target resonant frequency of the LVBAW resonator, and the second term is half of a difference between a finger to finger pitch of the comb-shaped electrode and a respective width of each finger.

2. The MEMS device of claim 1, wherein the first reflector includes a Bragg mirror.

3. The MEMS device of claim 1, wherein the side is a first side, and the second metal layer includes a third reflector on a second side of the IDT opposite to the first side, the third reflector being spaced apart from the IDT by the distance.

4. The MEMS device of claim 3, wherein the second reflector includes first metal strips, the third reflector includes second metal strips, and a width of each of the first and second metal strips is based on the quarter of the wavelength.

5. The MEMS device of claim 1, wherein the LVBAW resonator further comprises a third reflector on a portion of the second metal layer, and the portion of the second metal layer is between the first and third reflectors.

6. The MEMS device of claim 1, wherein the first metal layer is configured to be a non-electrified floating plate, and the IDT includes first and second electrodes, in which one of the first or second electrodes are coupled to a ground terminal.

7. The MEMS device of claim 1, wherein the first metal layer is coupled to a ground terminal.

8. The MEMS device of claim 1 being a delay line, wherein the IDT is a first IDT, the second metal layer includes a second IDT on a side of the first IDT, and LVBAW resonator further comprises:
   an input port coupled to the first IDT; and
   an output port coupled to the second IDT.

9. The MEMS device of claim 8, wherein the width is a first width, the fingers are first fingers, the second IDT includes a second comb-shaped electrode having second fingers, and each second finger has a respective second width different from the first width.

10. The MEMS device of claim 1, wherein the finger to finger pitch is based on half of the wavelength.

11. The MEMS device of claim 10, wherein the width less than one half of the wavelength of the signal.

12. The MEMS device of claim 11, wherein the comb-shaped electrode is a first comb-shaped electrode, the fingers are first fingers, and the IDT includes a second comb-shaped electrode having second fingers, the first fingers interlocks with the second fingers, and each of the second fingers has a respective width less than half of the wavelength.

13. The MEMS device of claim 12, wherein the finger to finger pitch is a first finger to finger pitch; and
   wherein a second finger to finger pitch of a pair of adjacent first and second fingers is based on half of the wavelength.

14. The MEMS device of claim 10, wherein:
   the first metal layer has a first thickness;
   the piezoelectric layer has a second thickness;
   the second metal layer has a second thickness; and
   a sum of the first, second and third thicknesses is less than 0.75 of a respective width of both first and second fingers.

15. The MEMS device of claim 1, wherein the second reflector include metal strips that are electrically isolated from each other.

16. The MEMS device of claim 1, wherein the wavelength is based on a propagation speed of the signal between the IDT and the second reflector.

17. The MEMS device of claim 1, wherein adjacent fingers are separated by a space; and
   wherein the respective width of each finger is wider than the space.

18. The MEMS device of claim 1, wherein adjacent fingers are separated by a space; and
   wherein the respective width of each finger is narrower than the space.

19. A method of operating a laterally vibrating bulk acoustic wave (LVBAW) resonator, the method comprising:
   generating a signal at the LVBAW resonator, in which the signal has a resonant frequency of the LVBAW resonator, and the LVBAW resonator includes:

an interdigital transducer (IDT), the IDT having a comb-shaped electrode, the comb-shaped electrode having fingers;

a first reflector under or above the IDT; and a second reflector on a side of the IDT, the second reflector being spaced from the IDT by a distance based on a sum of first and second terms, the first term is a product of an odd integer and a quarter of a wavelength of the signal, and the second term is half of a difference between a finger to finger pitch of the comb-shaped electrode and a respective width of each finger;

reflecting a vertical component of the signal towards the IDT by the first reflector; and reflecting a lateral component of the signal wave towards the IDT by the second reflector.

20. The method of claim 19, wherein the side is a first side, and the LVBAW resonator includes a third reflector on a second side of the IDT opposite to the first side, the third reflector being spaced apart from the IDT by the distance; and wherein the method further comprising reflecting the lateral component of the signal towards the IDT by the third reflector.

21. The method of claim 19, wherein the signal is a first signal, the resonant frequency is a first resonant frequency, and the method further comprises:

applying a force to the LVBAW resonator; and generating a second signal at the LVBAW resonator responsive to the force, the second signal having a second resonant frequency of the LVBAW resonator.

22. The method of claim 21, further comprising:

determining a difference between the first and second resonant frequencies; and determining a measure of the force based on the difference.

* * * * *